United States Patent
Tian et al.

(10) Patent No.: US 8,951,851 B2
(45) Date of Patent: Feb. 10, 2015

(54) METHOD OF MANUFACTURING LOW TEMPERATURE POLYSILICON FILM, THIN FILM TRANSISTOR AND MANUFACTURING METHOD THEREOF

(71) Applicant: Boe Technology Group Co., Ltd., Beijing (CN)

(72) Inventors: Xueyan Tian, Beijing (CN); Chunping Long, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/086,207

(22) Filed: Nov. 21, 2013

(65) Prior Publication Data

US 2014/0141579 A1 May 22, 2014

(30) Foreign Application Priority Data

Nov. 22, 2012 (CN) .......................... 2012 1 0479947

(51) Int. Cl.
| | |
|---|---|
| H01L 29/66 | (2006.01) |
| H01L 21/02 | (2006.01) |
| C30B 13/24 | (2006.01) |
| C30B 29/06 | (2006.01) |
| B23K 26/00 | (2014.01) |
| B23K 26/06 | (2014.01) |
| B23K 26/073 | (2006.01) |
| B23K 26/08 | (2014.01) |

(52) U.S. Cl.
CPC .......... *H01L 21/02686* (2013.01); *C30B 13/24* (2013.01); *C30B 29/06* (2013.01); *H01L 21/02488* (2013.01); *H01L 21/02532* (2013.01); *H01L 21/02592* (2013.01); *H01L 21/02595* (2013.01); *H01L 29/66757* (2013.01); *B23K 26/0042* (2013.01); *B23K 26/0066* (2013.01); *B23K 26/063* (2013.01); *B23K 26/0734* (2013.01); *B23K 26/0738* (2013.01); *B23K 26/083* (2013.01); *B23K 2201/42* (2013.01); *B23K 2203/00* (2013.01)
USPC .......................................... 438/166; 438/487

(58) Field of Classification Search
None
See application file for complete search history.

(56) References Cited

U.S. PATENT DOCUMENTS

| | | | |
|---|---|---|---|
| 5,851,862 A | 12/1998 | Ohtani et al. | |
| 2003/0173601 A1* | 9/2003 | Machida et al. | 257/288 |
| 2005/0079033 A1 | 4/2005 | Benedetti et al. | |
| 2005/0079294 A1* | 4/2005 | Lin et al. | 427/553 |
| 2008/0135848 A1* | 6/2008 | Yamazaki et al. | 257/66 |

FOREIGN PATENT DOCUMENTS

| | | |
|---|---|---|
| CN | 101894744 A | 11/2010 |
| CN | 102651311 A | 8/2012 |
| EP | 2523216 A1 | 11/2012 |

OTHER PUBLICATIONS

Extended European Search Report dated Jan. 28, 2014; Appln. No. 13193762.5-1353.
First Chinese Office Action Appln. No. 201210479947.6; Issued Sep. 12, 2014.

* cited by examiner

Primary Examiner — Charles Garber
Assistant Examiner — Alia Sabur
(74) Attorney, Agent, or Firm — Ladas & Parry LLP

(57) ABSTRACT

A method of manufacturing a low temperature polysilicon film comprises: providing a substrate on a platform; forming a buffer layer on said substrate; forming an amorphous silicon layer on said buffer layer; and heating and annealing said amorphous silicon layer to allow said amorphous silicon layer to form a polycrystalline silicon layer; wherein a thermal insulating layer is formed on a bottom surface of said substrate or a top surface of the platform, before said buffer layer is formed on said substrate.

11 Claims, 2 Drawing Sheets

METHOD OF MANUFACTURING LOW TEMPERATURE POLYSILICON FILM, THIN FILM TRANSISTOR AND MANUFACTURING METHOD THEREOF

FIELD OF THE INVENTION

Embodiments of the present invention relate to a method of manufacturing a low temperature polysilicon film, a thin film transistor and a manufacturing method thereof.

BACKGROUND

As the rapid development of planar display technology, Active Matrix Organic Light Emitting Diodes (AMOLED) have become a future development trend of displays due to their excellent characteristics such as being more slim, self-luminating and high reaction rate. An active matrix organic light emitting diode may comprise an active switch, an insulating layer, a transparent electrode, a light emitting layer and a metal electrode formed in turn on a substrate, wherein the active switch is connected to the transparent electrode through a contact vias to control writing of image data. At present, in order to accommodate the large scale trend of AMOLEDs, active switches generally use low temperature polysilicon TFTs (LTPS-TFTs) as control elements for switching pixels. The quality of low temperature polysilicon films for manufacturing LTPS-TFTs has direct impact on electric performance of LTPS-TFTs. Therefore, the manufacturing technology of low temperature polysilicon film attracts increasing attention.

For conventional AMOLEDs, such as manufacturing a polysilicon film in back plate technology, excimer laser annealing (ELA), solid phase crystallization (SPC), metal-induced crystallization (MIC) methods are mainly used; while obtaining polysilicon film in the active layer of the transistors in back plate with excimer laser annealing is the only method that has been realized mass production.

In the conventional excimer laser annealing technology, as shown in FIGS. 1 and 2, the substrate 203 is directly placed on a base or platform 204 (typically with a stainless steel surface) for annealing, and a thin film layer 202 is formed on the substrate 203. After heating treatment the thin film layer 202 under high temperature and laser annealing with a laser beam 201, the fabrication of polysilicon film is completed. Therein, the thin film layer 202 includes a silicon nitride layer 101, a silicon dioxide layer 102 and an amorphous silicon layer 103 formed subsequently on the substrate 203, wherein the silicon nitride layer 101 and the silicon dioxide layer 102 form a buffer layer. In the manufacturing process of said low temperature polysilicon film, since the substrate 203 contacts the base 204 directly, heat transfer rate is fast, resulting in the short cooling time for the molten silicon layer (about 100 ns). The solidifying is too quick to allow the crystal nucleus to grow to larger size with enough time. Therefore, the manufactured polysilicon thin film transistor has a mobility significantly impacted by grain size.

SUMMARY

According to an aspect of the present invention, a method of manufacturing a low temperature polysilicon film, comprising:
providing a substrate on a base;
forming a buffer layer on said substrate;
forming an amorphous silicon layer on said buffer layer; and
heat treating said amorphous silicon layer and laser annealing said amorphous silicon layer to allow said amorphous silicon layer to form a polycrystalline silicon layer;
wherein a thermal insulating layer is formed on a bottom surface of said substrate or a top surface of the base before said buffer layer is formed on said substrate.

According to another aspect of the present invention, a method of manufacturing a thin film transistor, comprising:
forming a polysilicon film on a substrate according to the method of manufacturing a polysilicon film as described above; and
forming an active layer of TFT by patterning process.

In yet another aspect of the present invention, a thin film transistor is manufactured by the method of manufacturing a thin film transistor as described above.

BRIEF DESCRIPTION OF DRAWINGS

Embodiments of the present invention will be described in more detail below with reference to drawings to allow one of ordinary skill in the art to understand the present invention more clearly, in which.

DETAIL DESCRIPTION

In order to make the purposes, technical solutions and advantages of embodiments of the present invention more clear, technical solutions according to the embodiments of the present invention will be described clearly and completely below in conjunction with the accompanying drawings of embodiments of the present invention. It is to be understood that the described embodiments are part of but not all of exemplary embodiments of the present invention. Based on the described exemplary embodiments of the present invention, all other embodiments obtained by those of ordinary skill in the art without creative labor shall fall into the protection scope of the present invention.

Unless otherwise defined, all the terminologies used herein have the same meanings as commonly understood by one of ordinary skill in the art to which the present invention belongs. The terms "first," "second," etc., which are used in the description and the claims of the present application, are not intended to indicate any sequence, amount or importance, but for distinguishing various components. Also, the terms such as "a/an," "one," or "the" etc., are not intended to limit the amount, but for indicating the existence of at lease one. The terms "comprise/comprising," "include/including," etc., are intended to specify that the elements or the objects stated before these terms encompass the elements or the objects and equivalents thereof listed after these terms, but not preclude other elements or objects. The phrases "connect", "connected", etc., are not intended to define a physical connection or mechanical connection, but may include an electrical connection/coupling, directly or indirectly. "On," "above," "under," "below" and the like are only used to indicate relative position relationship, and when the position of the object which is described is changed, the relative position relationship may be changed accordingly.

Embodiment 1

Figure 1:
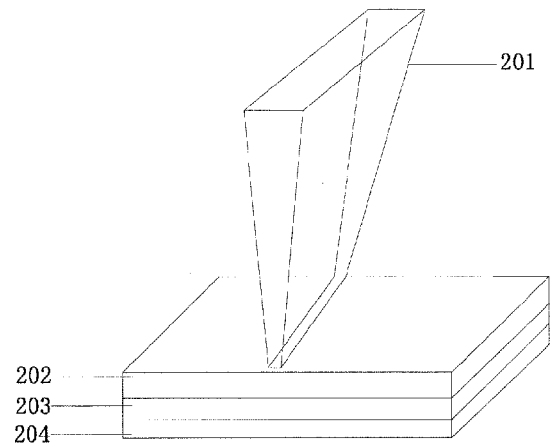
FIG. 1 is a schematic diagram of fabrication process of a low temperature polysilicon film in prior art.
Figure 2:
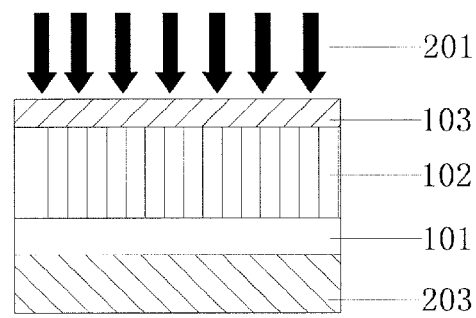
FIG. 2 is a schematic diagram of laser annealing process of a thin film layer structure in FIG. 1.
Figure 3:
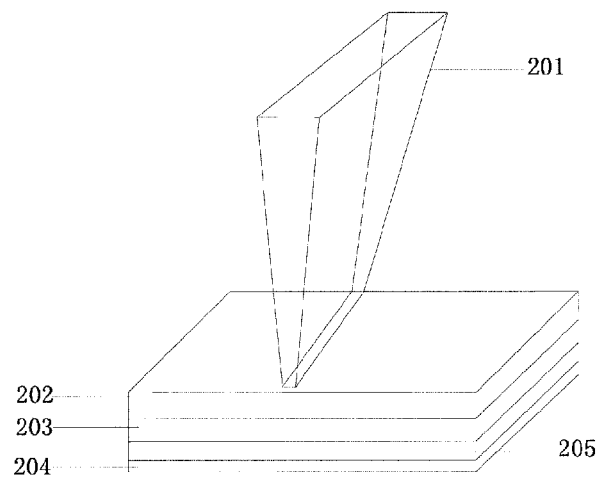
FIG. 3 is a schematic diagram of a fabrication process of low temperature polysilicon film according to embodiment 1 of the present invention.

The present embodiment provides a method of manufacturing a low temperature polysilicon film, as shown in FIG. 3, comprising:

(1) forming a layer of thermal insulating layer 205 on a top surface of a polysilicon film fabrication base 204. The thermal insulating layer 205 can be formed with a high temperature resistant aqueous thermal insulating/heat-preservation material. For example, the high temperature resistant aqueous heat-preservation material may be formed on the base 204 by spraying process to form a thermal insulating layer 205. The thickness of the thermal insulating layer 205 may be in the range of 0.05 mm –-0.2 mm. Since a high temperature resistant aqueous refractory material, such as the available Huixin furnace insulation heat preservation paint HX-012/2000, is used, which can resist a temperature up to 1800□ with an excellent thermal insulating effect, and the coefficient of heat conductivity of the coating is only 0.03 W/m.K, it is possible to effectively suppress heat conduction and efficiency of heat insulation and heat preservation may be as high as about 90%.

(2) providing a substrate 203, forming a polysilicon thin film layer 202 on the substrate 203 after the substrate 203 is pre-cleaned. The substrate 203 may be made of suitable material, such as quartz, as long as it can bear a temperature of 600 Celsius degrees, for example.

The manufacturing method of the polysilicon thin film layer 202 comprises: depositing a buffer layer 101 and 102 by using plasma enhanced chemical vapor deposition (PECVD), and then depositing an amorphous silicon thin film layer 103. The buffer layer may be a two-layer structure of silicon nitride layer 101 and silicon dioxide layer 102, for example. The bottom layer of the buffer layer is a silicon nitride layer 101 with a thickness of 50-150 nm, and the top layer of the buffer layer is a silicon dioxide layer 102 with a thickness of 100-350 nm, for example. An amorphous silicon thin film layer 103 with a thickness of 30-60 nm is formed on the silicon dioxide layer 102.

(3) heat treating the amorphous silicon thin film layer 103, annealing it by excimer laser, so as to form a polysilicon thin film layer 202.

For example, the amorphous silicon thin film layer 103 is heat treated at a temperature from 400 to 500° C. for 0.5 to 3 hours, which is a dehydrogenating process for the amorphous silicon thin film layer 103. After heat treatment, the amorphous silicon thin film layer 103 is annealed by a laser beam 201 of an excimer laser. Similar to the excimer laser annealing process in conventional technology, during annealing, the laser beam 201 is fixed and the platform/base 204 is moved to perform the entire laser scanning process. The excimer laser used for excimer laser annealing may be any one of xenon chloride, krypton fluoride or argon fluoride excimer laser. In this embodiment, a xenon chloride excimer laser with a wavelength of about 308 nm is used, wherein the laser pulse frequency is about 300 Hz, the overlap ratio is 92% -98% and the laser energy density is 200-500 mJ/cm$^2$.

Said low temperature polysilicon film is a polysilicon film that can resist temperature below 600 Celsius degrees.

In this embodiment, the fast heat dissipation process from the molten silicon layer to the substrate 203 and then to the platform 204 is suppressed by incorporating a high temperature resistant insulating layer 205 on the top surface of the platform 204. In the laser annealing process, the thermal conductivity of the substrate 203 is reduced by incorporating the high temperature resistant insulating layer 205, thereby slowing down the heat dissipation process from the substrate 203 to the platform 204. As such, the temperature gradient at the interface between the molten silicon and the substrate 203 is decreased to reduce heat flow from the molten silicon layer to the substrate 203, so that the crystallization time of the polysilicon is prolonged, and the grain size of the polysilicon film is increased, which can result in a polysilicon film with an average crystal grain size of about 1 micrometer.

Embodiment 2

The manufacturing method of the low temperature polysilicon film provided in this embodiment is similar to that of embodiment 1 and the difference resides in that: the thermal insulating layer 205 in the present embodiment is formed on the bottom surface of the substrate 203 rather than on the top surface of the platform 204, and such an thermal insulating layer 205 formed on the substrate 203 can also have the same functions and effect as that in the above embodiment.

Similarly, said polysilicon film may be a polysilicon film that can resist temperature below 600 Celsius degree.

Embodiment 3

The present embodiment provides a manufacturing method of a thin film transistor, comprising:

forming a polysilicon film on the substrate, and forming an active layer of TFT by patterning process.

Said polysilicon film is made by the low temperature polysilicon film manufacturing method of embodiment 1 or 2. Said polysilicon film may be a polysilicon film that can resist temperature below 600 Celsius degree.

The manufacturing method of thin film transistor in this embodiment may be applied to manufacture a top-gate type TFT, and also to manufacture a bottom-gate type TFT, or other structure variants. As long as the configuration includes a polysilicon film therein, the manufacturing method of the polysilicon film in embodiment 1 or 2 of the present invention may be used. The present invention is not limited thereto.

Figure 4:
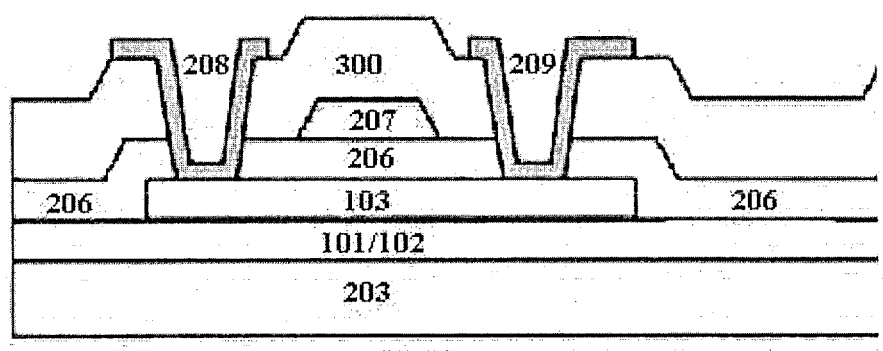
FIG. 4 is a schematic view of a TFT according to an example of the present invention.

For example, as shown in FIG. 4, said thin film transistor (TFT) manufacturing method further comprises: forming a gate insulating layer 206, a gate electrode 207, an inter-layer insulating film 300, and source electrode 208 and drain electrode 209 in turn above said active layer; said source electrode and drain electrode are connected to both ends of said active layer 202 through the insulating layer vias, respectively.

Said step of forming a gate insulating layer 206, a gate electrode 207, an inter-layer insulating film 300, and a source 208 and drain electrode 209 in turn above the active layer 103 comprises:

depositing a gate insulating layer over said active layer 103;

forming a gate metal film over said gate insulating layer, forming a pattern of gate electrode by patterning process and doping regions on both ends of said active layer to form an ion-doped region;

forming an inter-layer insulating film 300 over said gate electrode 207 and forming insulating layer vias through said gate insulating layer and said inter-layer insulating film by a patterning process, so as to expose the ion-doped regions on both ends of said active layer; and forming a source and drain metal film over said inter-layer insulating film 300 and forming a source electrode 208 and a drain electrode 209 by a patterning process, said source electrode 208 and drain electrode 209 are connected to the ion-doped regions on both ends of said active layer through said insulating layer vias, respectively, as illustrated in FIG. 4.

In the thin film transistor manufactured by the manufacturing method of thin film transistor in the present embodiment, the grain size of the polysilicon film is larger and the distribution of the grains in the film is uniform, as well as the surface roughness is improved, all of which can be helpful in preventing the large leakage current, non-uniform mobility and threshold voltage of the thin film transistor.

Embodiment 4

The present embodiment provides a low temperature polysilicon film transistor, in which the polysilicon film is manufactured by the manufacturing method of the low temperature polysilicon film in embodiment 1 or 2. The manufacturing method of polysilicon film in embodiment 2 is used to manufacture the polysilicon film and then manufacture the thin film transistor, in which a thermal insulating layer 205 is formed on the bottom surface of said substrate.

Said heat preservation thermal insulating layer 205 is formed with high temperature resistant aqueous heat-preservation material.

The polysilicon film in the thin film transistor in the present embodiment is manufactured by the manufacturing method of polysilicon film in embodiment 1 or 2. Since the resulted polysilicon film has large grain size and the grains distributes uniformly, it can prevent large leakage current, non-uniform mobility and threshold voltage of the thin film transistor.

Embodiment 5

The present embodiment provides an array substrate comprising the thin film transistor described in embodiment 4. When the array substrate thus formed is used for a display back plate, it can avoid the defects of low mobility, large leakage current of thin film transistors and non-uniform mobility and threshold voltage. It is also applicable to active matrix organic light emitting diodes (AMOLED) and low temperature polysilicon thin film transistor liquid crystal displays (LTPS TFT-LCD).

Embodiment 6

The present embodiment provides a display device comprising the array substrate described in embodiment 5. The display device of the present embodiment may be an active matrix organic light emitting diode (AMOLED) or a liquid crystal display. Since the display device uses low temperature polysilicon thin film transistors with stable electrical characteristics, the display quality of the display device is enhanced.

In the above embodiments, embodiments of the present invention suppress the fast heat dissipation process from the molten silicon layer to the substrate 203 and then to the platform 204 by incorporating a high temperature resistant insulating layer 205 on the top surface of the platform 204 or the bottom surface of the substrate. In the laser annealing process, the thermal conductivity of the substrate 203 is reduced by incorporating the high temperature resistant insulating layer 205, thereby slowing down the heat dissipation process from the substrate 203 to the platform 204. As such, the temperature gradient at the interface between the molten silicon and the substrate 203 is decreased to reduce heat flow from the molten silicon layer to the substrate 203, so that the crystallization time of the polysilicon is prolonged, and the grain size of the polysilicon film is increased. The process used in the embodiments of the present invention is simple to be handled in production, and no raw material is wasted. And the resulted polysilicon thin film transistors with larger grains exhibit good mobility. The low temperature polysilicon film obtained by this method may be used as the active layer of a low temperature polysilicon thin film transistor, and is applicable to active matrix organic light emitting diodes (AMOLED) and low temperature polysilicon thin film transistor liquid crystal display (LTPS TFT-LCD).

Above embodiments of the present invention are only exemplary embodiments and implementations and are not intended to limit the protection scope of the present invention. Without departing from the spirit and scope of the invention, those skilled in the art can contemplate numerous other embodiments, variations and modifications, which shall belong to the protection scope of the present invention.

The invention claimed is:

1. A method of manufacturing a low temperature polysilicon film, comprising:
   providing a substrate on a platform;
   forming a buffer layer on said substrate;
   forming an amorphous silicon layer on said buffer layer; and
   heat treating and laser annealing said amorphous silicon layer to allow it to form a polycrystalline silicon layer;
   wherein a thermal insulating layer is formed on a bottom surface of said substrate or a top surface of the platform, before said buffer layer is formed on said substrate.

2. The method according to claim 1, wherein said thermal insulating layer is formed with high temperature resistant aqueous heat-preservation material.

3. The method according to claim 1, wherein said thermal insulating layer is formed by spraying process.

4. The method according to claim 1, wherein the heat treating and laser annealing said amorphous silicon layer comprises:
   heat treating said amorphous silicon layer at a temperature from 400 to 500° C. for 0.5 to 3 hours; and
   annealing the heat treated amorphous silicon thin film layer by an excimer laser under a laser pulse frequency of 300 Hz, an overlap ratio of 92%-98% and an energy density of 200-500 mJ/cm$^2$.

5. The method according to claim 4, wherein the excimer laser comprises any of a xenon chloride, a krypton fluoride or an argon fluoride excimer laser.

6. A method of manufacturing a thin film transistor, comprising:
   forming a polysilicon film on the substrate according to the method of manufacturing a low temperature polysilicon film of claim 1, and
   forming an active layer of TFT by a patterning process.

7. The method according to claim 6, further comprising:
   forming a gate insulating layer, a gate electrode, an inter-layer insulating film, a source electrode and a drain electrode in turn on said active layer, wherein said source electrode and said drain electrode are connected to both ends of said active layer through insulating layer vias, respectively.

8. The method according to claim 7, wherein said forming a gate insulating layer, a gate electrode, an inter-layer insulating film and a source and drain electrode in turn on said active layer comprises:
   depositing a gate insulating layer over said active layer;
   forming a gate metal film over said gate insulating layer, patterning the gate electrode and doping regions on both ends of said active layer to form an ion doped region;
   forming an inter-layer insulating film over said gate electrode, and forming insulating layer vias through said gate insulating layer and said inter-layer insulating film by a patterning process to expose the ion doped regions on both ends of said active layer;
   forming a source and drain metal film over said inter-layer insulating film and forming a source electrode and a drain electrode by a patterning process, said source electrode and drain electrode are connected to the ion-doped regions on both ends of said active layer through said insulating layer vias, respectively.

9. A thin film transistor manufactured by the method of claim 6.

10. The thin film transistor according to claim 9, wherein a bottom surface of said substrate is formed with a thermal insulating layer.

11. The thin film transistor of claim 10, wherein said thermal insulating layer is formed with high temperature resistant aqueous heat-preservation material.

\* \* \* \* \*